(12) United States Patent
Storms

(10) Patent No.: US 11,514,771 B2
(45) Date of Patent: Nov. 29, 2022

(54) MULTIMODAL VOLTAGE TEST DEVICE AND METHOD OF OPERATION

(71) Applicant: Consolidated Edison Company of New York, Inc., New York, NY (US)

(72) Inventor: William B. Storms, Deer Park, NY (US)

(73) Assignee: CONSOLIDATED EDISON COMPANY OF NEWYORK, INC., New York, NY (US)

( * ) Notice: Subject to any disclaimer, the term of this patent is extended or adjusted under 35 U.S.C. 154(b) by 0 days.

(21) Appl. No.: 17/336,811

(22) Filed: Jun. 2, 2021

(65) Prior Publication Data
US 2022/0012998 A1    Jan. 13, 2022

Related U.S. Application Data

(60) Provisional application No. 63/049,303, filed on Jul. 8, 2020.

(51) Int. Cl.
*G08B 21/18* (2006.01)
*G01R 19/165* (2006.01)

(52) U.S. Cl.
CPC ..... *G08B 21/185* (2013.01); *G01R 19/16566* (2013.01)

(58) Field of Classification Search
CPC .................................................. G08B 21/185
See application file for complete search history.

(56) References Cited

U.S. PATENT DOCUMENTS

| 1,083,799 | A | | 1/1914 | Caldwell |
| 4,977,530 | A | * | 12/1990 | Cline ................. G01R 31/2834 340/661 |
| 6,803,777 | B2 | | 10/2004 | Pfaff et al. |
| 8,059,005 | B2 | * | 11/2011 | Henricks ........... H02J 13/00036 340/636.15 |
| 8,779,775 | B2 | | 7/2014 | Sexton et al. |
| 10,837,994 | B2 | | 11/2020 | Whisenand et al. |
| 2003/0128036 | A1 | * | 7/2003 | Henningson ........... G01R 31/58 324/426 |
| 2009/0128124 | A1 | * | 5/2009 | Garland ............... G01R 15/125 324/115 |
| 2009/0128125 | A1 | * | 5/2009 | Garland ............... G01R 15/125 324/115 |
| 2009/0128126 | A1 | * | 5/2009 | Garland ............... G01R 15/125 324/115 |
| 2010/0073175 | A1 | * | 3/2010 | Lontka ................. G08B 29/123 340/635 |

(Continued)

*Primary Examiner* — Travis R Hunnings
(74) *Attorney, Agent, or Firm* — Cantor Colburn LLP

(57) ABSTRACT

A multimodal voltage test device and method of operating is provided. The device includes a first electrical contact and a second electrical contact. A circuit electrically is disposed between the first electrical contact and the second electrical contact, the circuit being configured to measure a voltage between the first electrical contact and the second electrical contact. A first light source is electrically coupled to the circuit. An audio device is electrically coupled to the circuit, wherein the circuit is configured to cause the first light source to illuminate and to emit a first sound from the audio device in response to the voltage measured by the circuit being equal to or greater than a first threshold.

18 Claims, 3 Drawing Sheets

(56) References Cited

U.S. PATENT DOCUMENTS

| | | | |
|---|---|---|---|
| 2011/0074395 A1* | 3/2011 | Marzynski | G01R 15/125 |
| | | | 324/114 |
| 2017/0045565 A1* | 2/2017 | Whisenand | G01R 23/16 |
| 2021/0356530 A1* | 11/2021 | Yang | G08B 3/10 |
| 2022/0232078 A1* | 7/2022 | Colston | H04L 12/28 |

* cited by examiner

MULTIMODAL VOLTAGE TEST DEVICE AND METHOD OF OPERATION

CROSS REFERENCE TO RELATED APPLICATIONS

This application claims the benefit of U.S. Provisional Application Ser. No. 63/049,303 filed Jul. 8, 2020, the entire disclosure of which is incorporated herein by reference.

BACKGROUND

The subject matter disclosed herein relates to a device for testing for voltage on electrical connectors, and in particular to a testing device that has multiple modes of notifying the operator of the voltage status of the electrical conductors.

It is common when personnel are working on electrical circuits, such as secondary splicing operations for example, for a test device to be used to determine the status of the electrical conductors before the personnel perform tasks on the conductors. These test devices, sometimes referred to as test lamps measure electrical voltage and provide a visual indication of the voltage potential on the conductors. Typically the test lamp has two electrical connectors, one with a clip and one with a probe. In some applications, the clip is attached to ground, the personnel touch the probe to different conductors to determine whether the conductor has electrical power being supplied to it. The test lamp has a light bulb and the intensity of the light emitted by the light bulb indicates to the personnel what level of electrical voltage is present on the conductor, such as 120 volts or 220 volts for example.

In some applications, such as electrical utility personnel operating in the field for example, it can be difficult to determine whether the conductor operating at 120 volts or 220 volts due to ambient lighting. Accordingly, while existing test lights are suitable for their intended purposes the need for improvement remains, particularly in providing a voltage measurement device that includes multiple modes of indicators for notifying the operator of an electrical voltage level on an electrical conductor.

BRIEF DESCRIPTION

According to one aspect of the disclosure a multimodal voltage test device is provided. The device includes a first electrical contact and a second electrical contact. A circuit electrically is disposed between the first electrical contact and the second electrical contact, the circuit being configured to measure a voltage between the first electrical contact and the second electrical contact. A first light source is electrically coupled to the circuit. An audio device is electrically coupled to the circuit, wherein the circuit is configured to cause the first light source to illuminate and to emit a first sound from the audio device in response to the voltage measured by the circuit being equal to or greater than a first threshold.

According to another aspect of the disclosure, a method of determining an electrical status of an electrical system is provided. The method includes connecting a first electrical contact on a first electrical conductor. A second electrical contact is touched to a second electrical conductor. A voltage is measured between the first electrical lead and a second electrical lead. A first light source is illuminated in response to the measured voltage being equal to or greater than a first threshold. A first sound is emitted from an audio device in response to the measured voltage being equal to or greater than the first threshold.

These and other advantages and features will become more apparent from the following description taken in conjunction with the drawings.

BRIEF DESCRIPTION OF DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

The detailed description explains embodiments of the disclosure, together with advantages and features, by way of example with reference to the drawings.

DETAILED DESCRIPTION

Embodiments of the present disclosure provide advantages in the determination of a status of an electrical characteristic of an electrical conductor. Embodiments herein provide for a testing device that includes multiple modes of indicating to an operator the electrical characteristic that provides advantages in allowing the identification of the electrical characteristic under a variety of environmental conditions.

Figure 1:
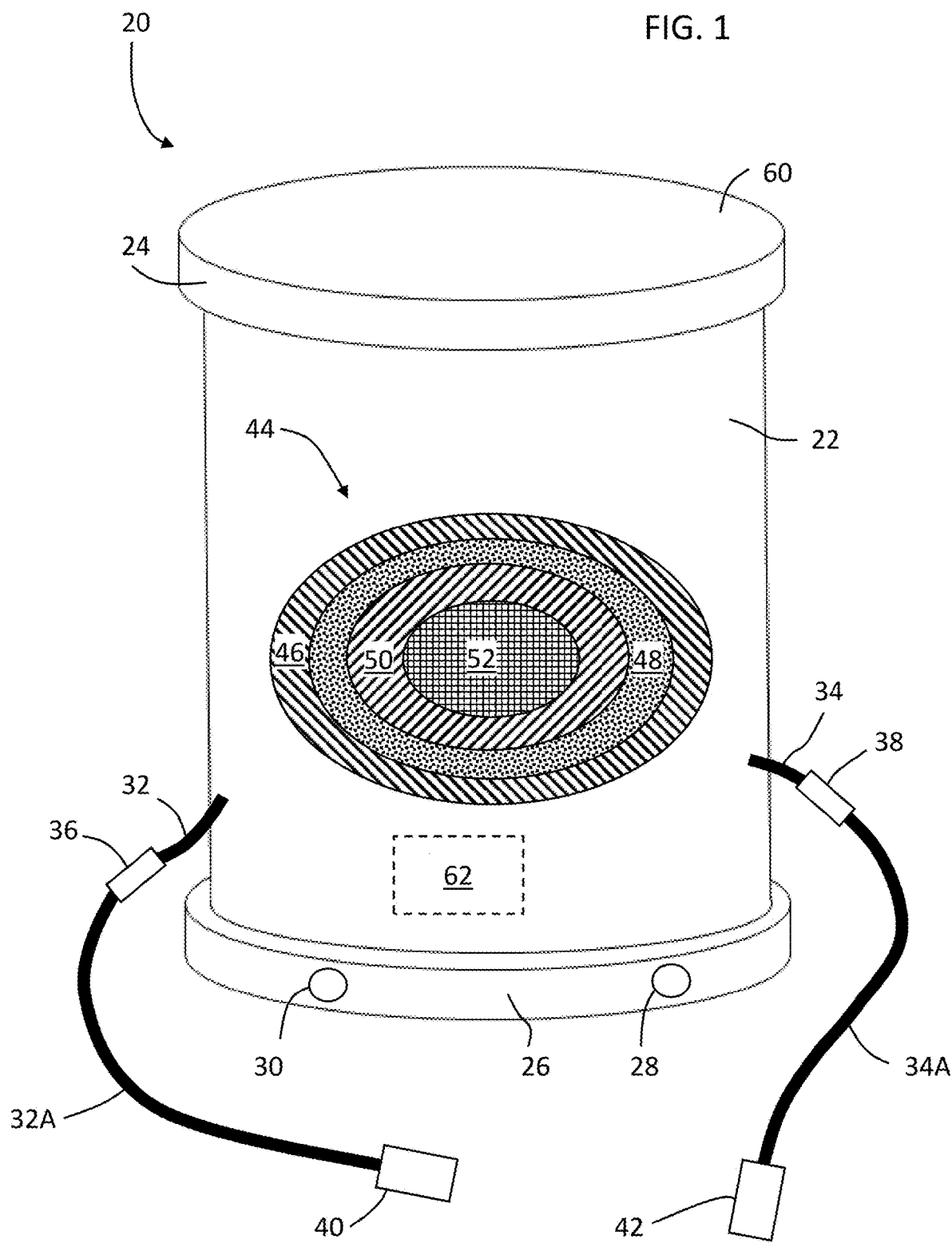
FIG. 1 is a perspective view of a multimodal test device in accordance with an embodiment.
Figure 2:
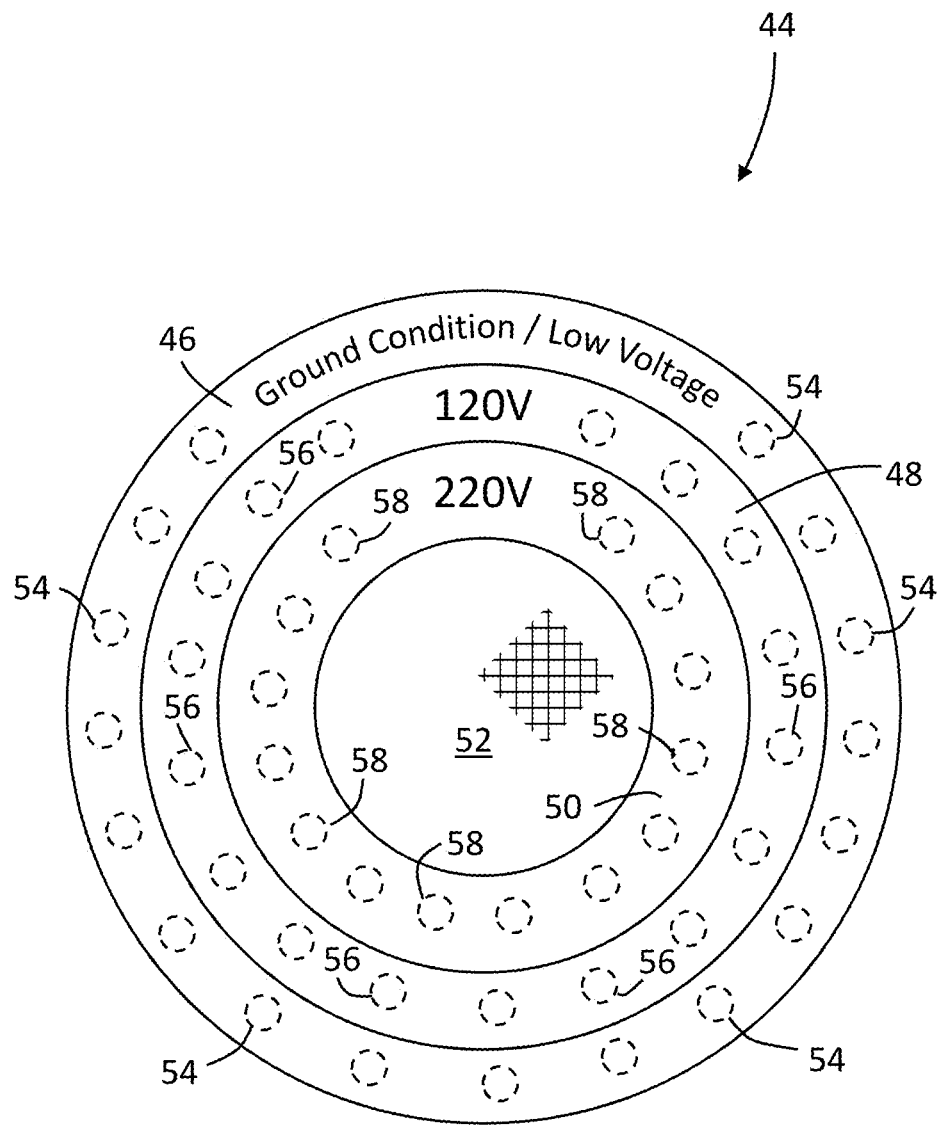
FIG. 2 is an illustration of an indicator for the test device of FIG. 1 in accordance with an embodiment.
Figure 3:
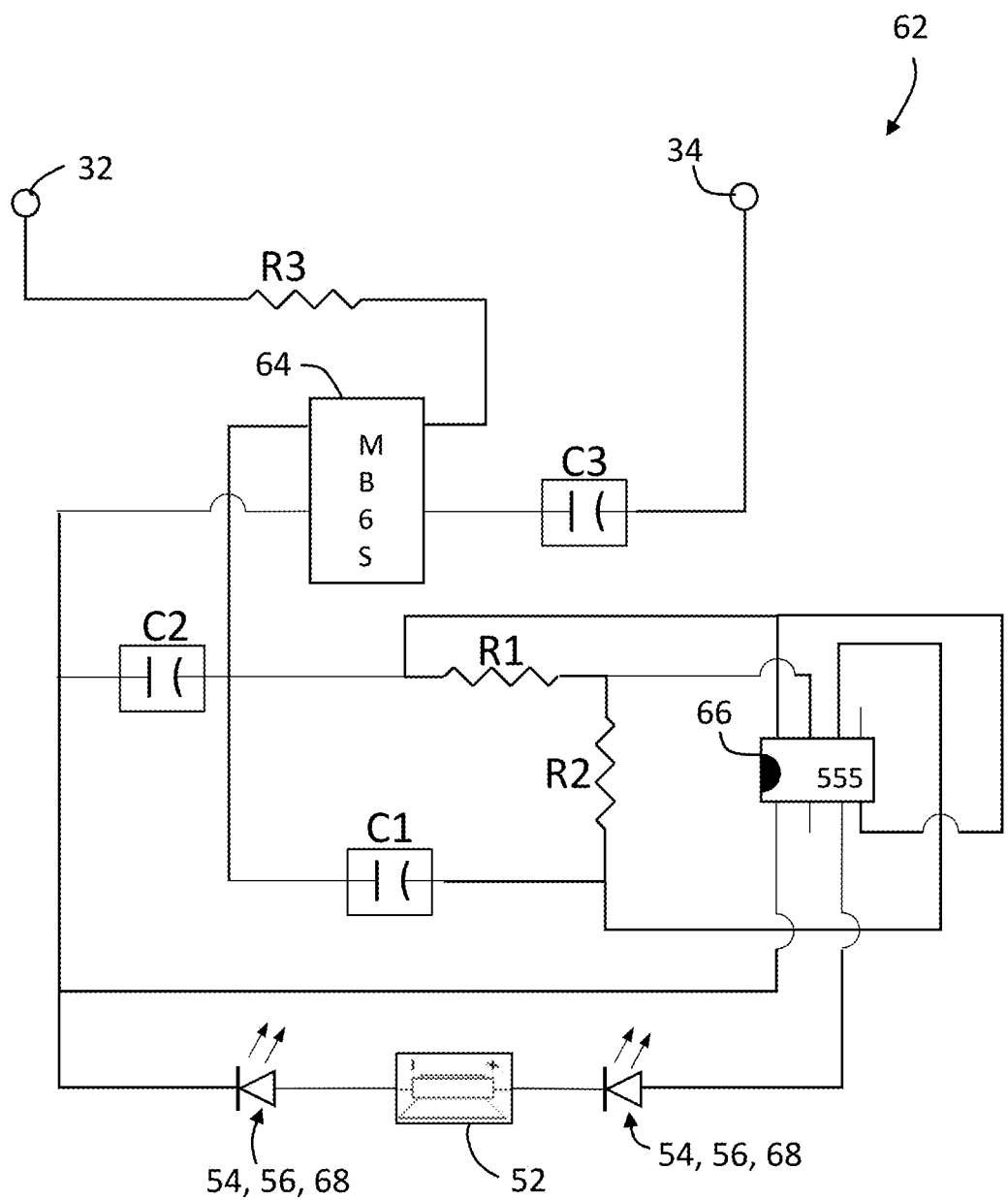
FIG. 3 is a schematic illustration of a circuit diagram for operating the test device of FIG. 1 in accordance with an embodiment.

Referring to FIGS. 1-3 an embodiment of an electrical test device 20 is shown that can determine electrical characteristics, such as voltage levels or a ground condition for example, on an electrical conductor (not shown). In an embodiment, the device 20 includes a housing 22 with a first bumper 24 on a first end and a second bumper 26 on a second end. The bumpers 24, 26 may be made from a plastic or an elastomeric material to protect the housing 22 when the device 20 is being transported or used. In an embodiment, the second bumper 26 includes one or more magnetic members 28, 30. The magnetic members 28, 30 may be disposed at least partially on the outside of the bumper 26 or encased within the bumper 26.

A first electrical lead 32 and a second electrical lead 34 extend from the housing 22. In an embodiment, the leads 32, 34 have connectors 36, 38 respectively that allow a portion 32A, 34A of the leads 32, 34 to be removably coupled to the device 20. The portions 32A, 34A may be exchanged to allow different contact members 40, 42 to be coupled to the device 20. The contact members 40, 42 may be any suitable electrical contact device, such as but not limited to a clip or a probe for example, that allows the device 20 to create an electrical connection between the device 20 and the electrical conductors to be tested. In an embodiment, the first lead 32 has a clip attached thereto and the second lead 34 has a probe attached thereto.

The device 20 further includes a user interface 44. In the illustrated embodiment, the user interface 44 includes a plurality of light sources 46, 48, 50 and an audio device 52. In the exemplary embodiment, the light sources 46, 48, 50 are of a different wavelength of light (i.e. color) to indicate a different measured electrical characteristic (e.g. voltage). In the exemplary embodiment, the audio device is a speaker. It should be appreciated that while embodiments herein may refer to a light source as emitting a particular wavelength of light (color), the light source may have a light that emits a white light and a colored lens or filter that emits a desired wavelength. In the illustrated embodiment, the light sources 46, 48, 50 are concentrically arranged.

In the illustrated embodiment, the first light source 46 defines the outer most band of the concentric light sources. The first light source 46 includes a plurality of light emitting diodes (LEDs) that are arranged about the circular band. In an embodiment, the first light source 46 emits light having a wavelength of about 500-560 nanometers (nm) or a green color. As will be discussed in more detail below, the first light source 46 is synchronously activated with the audio device 52 to indicate to the operator that measured electrical characteristic is within a first range, such as being less than 108 volts for example. In some embodiments, the first range may be defined as a percentage of the nominal voltage, such as 8-10% below the nominal voltage for example In an embodiment, the first light source 46 and the audio device 52 may be activated in response to a ground condition being measured. In an embodiment, the audio device emits a sound different from the low voltage sound in response to a ground condition being measured.

In an embodiment, the second light source 48 is disposed radially inward from the first light source 46. The second light source 48 includes a plurality of LEDs 56 that are arranged in a circular band. In an embodiment, the second light source 48 emits light of about 560-600 nm or a yellow color. As will be discussed in more detail, the second light source 48 is synchronously activated with the audio device 52 to indicate to the operator that the measured characteristic is within a second range, such as greater than 20 volts and less than about 220 volts. In an embodiment the second light source and the audio device 52 are activates when the measured characteristic is about 120 volts. In an embodiment, the audio device 52 emits a different sound, a different sound level, or a different pattern of sounds when the second light source 48 is activated than when the first light source 46 is activated.

In an embodiment, the third light source 50 is disposed radially inward from the second light source 48. The third light source 50 includes a plurality of LEDs 58 that are arranged in a circular band. In an embodiment, the third light source 50 emits light of a wavelength greater than 600 nm or a red color. As will be discussed in more detail, the third light source 50 is synchronously activated with the audio device 52 to indicate to the operator that the measured characteristic is within a third range, such as greater than 220 volts. In an embodiment the third light source and the audio device 52 are activated when the measured characteristic is about 220 volts. In an embodiment, the audio device 52 emits a different sound, a different sound level, or a different pattern of sounds when the third light source 50 is activated than when the first light source 46 or the second light source 48 is activated.

It should be appreciated that while the user interface 44 is illustrated as being on the sidewall of the housing 22, this is for example purposes and the claims should not be so limited. In other embodiments, the user interface 44 may be positioned on other portions of the device 20, such as a top surface 60 for example. Further, while the user interface 44 is illustrated with the light sources being arranged as a set of concentric rings, this is for example purposes and the claims should not be so limited. In other embodiments, the user interface 44 may be configured in different shapes, such as a set of parallel bars or strips for example.

Referring now to FIG. 3, an embodiment of a circuit 62 is shown for sounding an alarm and flashing a light in response to a measured electrical characteristic, such as voltage. In an embodiment, the circuit 62 includes a bridge rectifier 64 that receives an input AC electrical power from the leads 32, 34 and outputs a direct current. In an exemplary embodiment, the circuit 62 further includes a timer device 66 that receives the direct current and outputs a signal to the light LED's 54, 56, 58 that are arranged in series with the audio device 52. In an embodiment, the timer device 66 causes the LEDs 54, 56, 58 to flash light and the audio device 52 to make a sound (e.g. beep) on and off simultaneously or synchronously at a certain rate based at least in part on the measured electrical characteristic (e.g. voltage). The circuit further includes capacitors C1, C2, C3 and resistors R1, R2, R3. The values of the capacitors C1, C2, C2 and resistors R1, R2, R3 define the ranges of the measured electrical characteristic, to activate either the first light source 46, the second light source 48, or the third light source 50. In the exemplary embodiment the capacitors C1, C2, C3 have values of 2 nF, 100 nF, and 191. nF respectively. In the exemplary embodiment, the resistors R1, R2, R3 have values of 1μ-ohm, 10μ-ohm, 0.557μ-ohm.

It should be appreciated that the circuit 62 is exemplary and the claims should not be so limited. In other embodiments, a different circuit may be configured to perform the same or substantially similar functionality to that described herein.

In operation, the operator clips or touches the contact members 40, 42 to the electrical conductors to be tested, such as electrical conductors that are to be coupled as part of a secondary splicing operation for example. The electrical power (if present) on the electrical conductor flows to the circuit 62, which causes the user interface to emit light and sound based on the measured electrical characteristic (e.g. voltage).

The term "about" is intended to include the degree of error associated with measurement of the particular quantity based upon the equipment available at the time of filing the application.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof. It should also be noted that the terms "first", "second", "third", "upper", "lower", and the like may be used herein to modify various elements. These modifiers do not imply a spatial, sequential, or hierarchical order to the modified elements unless specifically stated.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A multimodal voltage test device comprising:
a first electrical contact;
a second electrical contact;
a circuit electrically disposed between the first electrical contact and the second electrical contact, the circuit being configured to measure a voltage between the first electrical contact and the second electrical contact;
a first light source electrically coupled to the circuit;
a second light source electrically coupled to the circuit and
an audio device electrically coupled to the circuit,
wherein the circuit is configured to cause the first light source to illuminate and to emit a first sound from the audio device in response to the voltage measured by the circuit being equal to or greater than a first threshold,
wherein the circuit is further configured to cause the second light source to illuminate and emit a second sound from the audio device in response to the voltage measured by the circuit being less than the first threshold and being equal to or greater than a second threshold.

2. The device of claim 1, further comprising a third light source electrically coupled to the circuit, wherein the circuit is further configured to cause the third light source to illuminate and emit a third sound from the audio device in response to the voltage measured by the circuit being equal to or less than a third threshold.

3. The device of claim 1, wherein the first threshold is about 220 volts.

4. The device of claim 1, wherein the first threshold is about 220 volts and the second threshold is about 120V.

5. The device of claim 2, wherein the first threshold is about 220 volts, the second threshold is about 120V, and the third threshold is less than 108 volts.

6. The device of claim 1, wherein at least one of the first electrical contact and the second electrical contact is a clip type contact.

7. The device of claim 1, wherein at least one of the first electrical contact and the second electrical contact is a probe type contact.

8. The device of claim 1, further comprising:
a housing, the circuit, the first light source and the audio device being disposed within the housing; and
at least one magnetic member coupled to the housing.

9. The device of claim 8, further comprising a first bumper member coupled to a first end of the housing.

10. The device of claim 9, wherein the at least one magnetic member is coupled to the first bumper member.

11. The device of claim 9, further comprising a second bumper member coupled to a second end of the housing, the second end being opposite the first end of the housing.

12. The device of claim 1, wherein the first light source emits light at a wavelength greater than 600 nanometers.

13. The device of claim 1, wherein the first light source emits light at a wavelength greater than 600 nanometers and the second light source emits light at a wavelength of between about 560-600 nanometers.

14. The device of claim 2, wherein the first light source emits light at a wavelength greater than 600 nanometers, the second light source emits light at a wavelength of between about 560-600 nanometers, and the third light source emits light at a wavelength of about 500-560 nanometers.

15. The device of claim 2, wherein the circuit is further configured to cause the third light source to illuminate and emit a fourth sound from the audio device in response to detecting a ground condition.

16. The device of claim 15, wherein the fourth sound is different from the third sound.

17. A method of determining an electrical status of an electrical system, the method comprising:
connecting a first electrical contact on a first electrical conductor;
touching a second electrical contact to a second electrical conductor;
measuring a voltage between the first electrical contact and the second electrical contact;
illuminating a first light source in response to the measured voltage being equal to or greater than a first threshold;
emitting a first sound from an audio device in response to the measured voltage being equal to or greater than the first threshold;
illuminating a second light source and emitting a second sound from the audio device in response to the measured voltage being less than the first threshold and being equal to or greater than a second threshold; and
illuminating a third light source and emitting a third sound from the audio device in response to the measured voltage being equal to or less than a third threshold.

18. The method of claim 17, wherein the first electrical conductor and the second electrical conductor are coupled as part of a secondary splicing operation.

* * * * *